United States Patent
Nicolino, Jr. et al.

(10) Patent No.: US 7,281,232 B1
(45) Date of Patent: Oct. 9, 2007

(54) METHOD AND APPARATUS FOR AUTOMATICALLY CHECKING CIRCUIT LAYOUT ROUTING

(75) Inventors: Sam J. Nicolino, Jr., Cupertino, CA (US); Ira G. Chayut, Cupertino, CA (US)

(73) Assignee: Nvidia Corporation, Santa Clara, CA (US)

( * ) Notice: Subject to any disclaimer, the term of this patent is extended or adjusted under 35 U.S.C. 154(b) by 281 days.

(21) Appl. No.: 10/875,997

(22) Filed: Jun. 23, 2004

Related U.S. Application Data

(60) Provisional application No. 60/544,689, filed on Feb. 12, 2004.

(51) Int. Cl.
*G06F 15/50* (2006.01)
*H03K 17/693* (2006.01)

(52) U.S. Cl. .................. 716/12; 716/13; 716/14; 716/15

(58) Field of Classification Search ............. 716/12–15
See application file for complete search history.

(56) References Cited

U.S. PATENT DOCUMENTS

| | | | |
|---|---|---|---|
| 5,787,006 A * | 7/1998 | Chevallier et al. ............. | 716/5 |
| 6,898,770 B2 * | 5/2005 | Boluki et al. .................. | 716/6 |
| 2002/0188920 A1* | 12/2002 | Lampaert et al. ............. | 716/10 |
| 2004/0078773 A1* | 4/2004 | Sharma et al. ................ | 716/13 |

* cited by examiner

*Primary Examiner*—Stacy A. Whitmore
*Assistant Examiner*—Magid Y. Dimyan

(57) ABSTRACT

A method and apparatus for checking topology layout routing is described. A method for checking topology layout routing includes accessing actual topology layout information of a circuit. Then, compliance topology information is established. Then, the method checks the actual topology layout information complies with the compliance topology information. Then, the method presents violations of the compliance topology information.

42 Claims, 24 Drawing Sheets

500

1100

1200

1300A

1300B

1300C

METHOD AND APPARATUS FOR AUTOMATICALLY CHECKING CIRCUIT LAYOUT ROUTING

RELATED U.S. APPLICATION

This application claims priority to the now abandoned provisional patent application Ser. No. 60/544,689, entitled "A Motherboard Layout Rule Checking System and Method," with filing date Feb. 12, 2004, which is hereby incorporated by reference, and assigned to the assignee of the present invention.

BACKGROUND OF THE INVENTION

1. Field of the Invention

Embodiments of the present invention relate to the field of printed circuit boards (PCBs). More particularly, embodiments of the present invention relate generally to the automatic checking of a circuit to its published design rules.

2. Related Art

Traditionally, motherboard layouts are checked in one of two methods. Checking of the motherboard layout on a PCB using the two methods typically occurs after a motherboard designer has completed layout with a layout design tool and before a geometric translation of the board is generated and sent to the PCB manufacturer.

The first traditional method requires manually checking each net or trace of a group of nets in a layout to make sure that its length, width, and spacing to other nets are in compliance with design rules required by chipsets on the motherboard. This often involved a tedious and time consuming series of operations that was error prone. For example, each net of a group is manually measured, segment by segment. Then the length of the net is entered into a spreadsheet. Thereafter, the length of the net is analyzed to determine if it is in compliance with a design rule for its associated group. This process is extremely tedious and typically required several days of effort per motherboard. Checking spacing compliance is particularly tedious and is not rigorously done.

Automating these checks allows for revalidation after every design modification to make sure that no new problems have been introduced while fixing the previous problem. This automation also facilitates early validation of partial board layouts, thereby allowing earlier fixes.

In the competitive motherboard market, time-to-market is extremely important. The first board to market may gain a huge advantage over competitor motherboards that emerge at a later date. As a result, because of the huge time investment needed, the manual checking of motherboard traces and the steps to fix violations of design rules takes low priority and is sometimes not performed. Unfortunately, signal integrity is compromised since design rule violations are not analyzed and fixed. This leads to a redesign of the board when problems occur, which ultimately delays time to market, or results in field failures. These adversely affect the reputation of the chipset manufacturer and stifle board sales.

A second approach involves entering the design rules into a layout design tool or schematic entry tool, or both. This requires the manual entry of the design rules by the motherboard manufacturer that is designing the motherboard. Insuring that the chipset manufacturer's design rules have been properly read, interpreted, and entered into these tools is problematic. Furthermore, these rules files may be considered proprietary by the motherboard manufacturer so it is difficult for the chipset manufacturer to check them for accuracy and completeness. Getting involved with the customer's schematics for compliance checking is also problematic. Because, the motherboard manufacturer often restricts access to parts of the schematic database as proprietary information. Also, the motherboard manufacturers sometimes use a schematic capture tool that does not have thorough automatic layout design rule checking capabilities. Finally, since different motherboard manufacturers do not typically use the same schematic capture tool, nor do they follow common naming conventions (e.g., for pin names), one common approach solution is very difficult to implement using the schematic entry flow. Therefore it is best if the motherboard manufacturer instead of the chipset designer performs the checks on the motherboard involving the schematic capture tool.

Modern boards are very complex and dense. As a result, using conventional techniques for checking board layout, it is impossible to economically build a board that satisfies all constraints.

As a result, traditional methods and systems for checking motherboard layout routing requires a significant investment of manual checking or data entry, which is tedious, time consuming and error prone.

Modern boards are very complex and dense, making it impossible to economically build a board that satisfies all constraints. It would be advantageous to have a solution that guides a designer in deciding which rules are most important.

SUMMARY OF THE INVENTION

Accordingly, various embodiments of the present invention disclose a method and apparatus for automatically checking various layout routing (e.g., motherboards, printed circuit boards (PCBs), semiconductor substrates, etc.). As a result, embodiments of the present invention are capable of automatically verifying designs have followed the published design rules. For example, automatically verifying designs as those set forth by a chipset used in a motherboard. Automating the process of checking decreases the time and cost of checking the layout. In addition, automating the processing of checking improves the quality of the review by removing the human error factor.

In one embodiment, a method for checking integrated circuit layout routing is described. The method includes accessing actual topology layout information. The actual topology layout is in a vector format that is derived from a topology layout of the circuit (e.g., a printed circuit board or substrate) under test. Compliance topology information for the circuit is established. The compliance topology information is based on custom design information that describes basic information of the circuit (e.g., a chipset used by the circuit under test, such as circuit components, the chipset name, etc.). The method automatically checks the topology layout information complies with the compliance topology information. Then, the method presents violations of the compliance topology information.

In another embodiment, a system for checking circuit topology layout routing is described. The system includes a compliance topology builder for building compliance topology information based on custom design information associated with an integrated circuit, on a PCB or substrate for example. The compliance topology information is generated from an overall list of design rules and design knowledge that is applicable to a variety of components (e.g., chipsets, processor, connectors, etc.) used in a variety of topology configurations. The design rules provide geometric constraints for the circuit under test based on the custom design information. The design knowledge maps a plurality of signals in the circuit under test based on the custom design information. The compliance topology information is used to verify that actual topology layout information associated with a circuit under test is in compliance with the compliance topology information.

The system also includes a translator for translating between actual topology layout information of the circuit under test and compliance topology information. The system also includes a compliance checker for automatically checking the actual topology layout information complies with the compliance topology information.

DETAILED DESCRIPTION OF THE INVENTION

Figure 1:
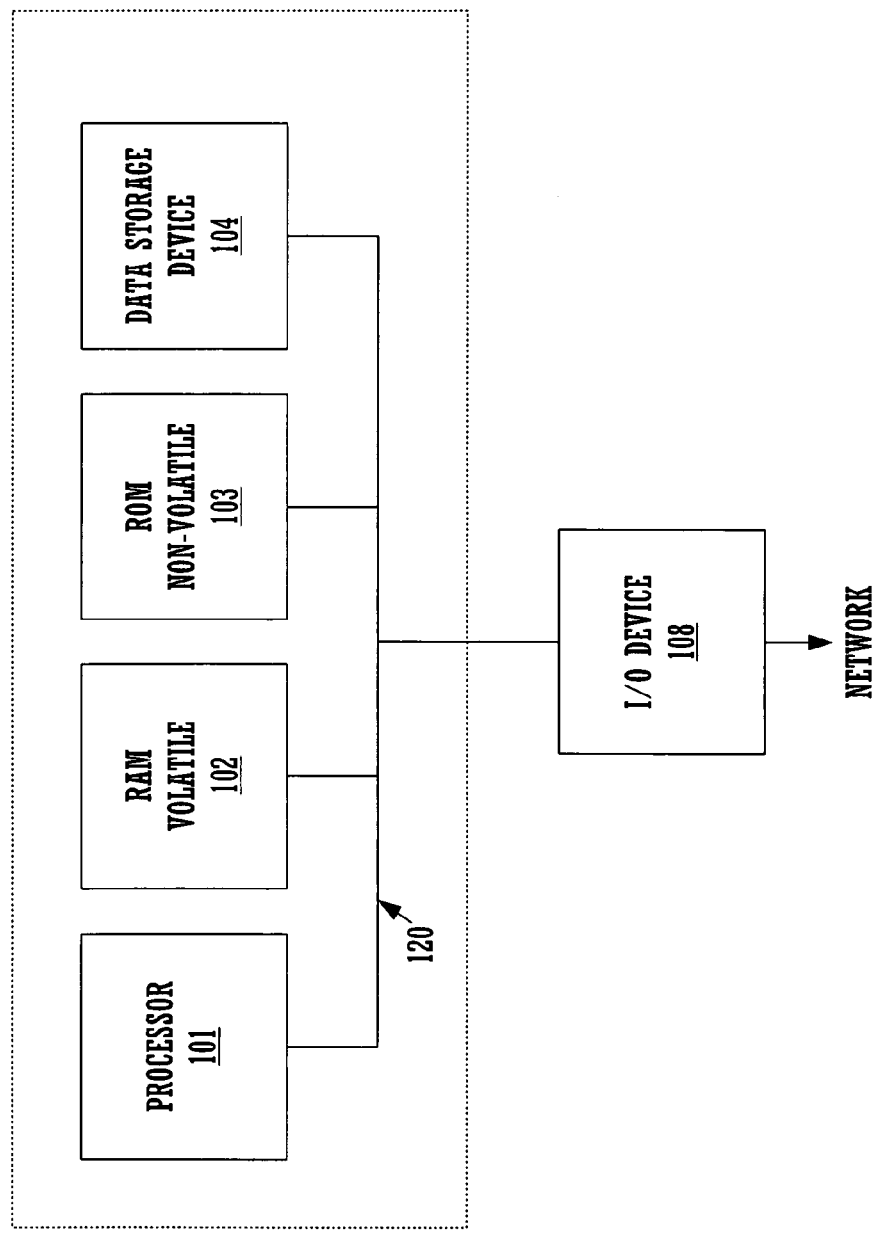
FIG. 1 is a block diagram of an exemplary electronic system that is capable of automatically checking circuit design routing complies with the published design rules, in accordance with one embodiment of the present invention.

Reference will now be made in detail to the preferred embodiments of the present invention, an apparatus and method for automatically checking circuit topology layout routing, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Notation and Nomenclature

Some portions of the detailed descriptions which follow are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "accessing," "checking," "presenting," "comparing," or the like, refer to the action and processes of a computer system, or similar electronic computing device, including an embedded system, that manipulates and transforms data represented as physical (electronic) quantities within the computer system's registers and memories into other data similarly represented as physical quantities within the computer system memories or registers or other such information storage, transmission or display devices.

Referring to FIG. 1, embodiments of the present invention are comprised of computer-readable and computer-executable instructions which reside, for example, in computer-readable media of a computer system that is capable of automatically checking routing in a layout of a circuit (e.g., formed in a printed circuit board or substrate layout). For example, embodiments of the present invention can be implemented on software running on a computer system.

FIG. 1 is a block diagram of exemplary embedded components of such a computer system 100 upon which embodiments of the present invention may be implemented. The computer system can be an embedded system, a personal computer, notebook computer, server computer, mainframe, networked computer, handheld computer, personal digital assistant, workstation, and the like.

Exemplary computer system 100 includes an internal address/data bus 120 for communicating information, a central processor 101 coupled with the bus 120 for processing information and instructions, a volatile memory 102 (e.g., random access memory (RAM), static RAM dynamic RAM, etc.) coupled with the bus 120 for storing information and instructions for the central processor 101, and a non-volatile memory 103 (e.g., read only memory (ROM), programmable ROM, flash memory, EPROM, EEPROM, etc.) coupled to the bus 120 for storing static information and instructions for the processor 101. Computer system 100 may also include various forms of disc storage 104 for storing information.

With reference still to FIG. 1, an optional signal Input/Output device 108 is coupled to bus 120 for providing a communication link between computer system 100 and a network environment. As such, signal Input/Output (I/O) device 108 enables the central processor unit 101 to communicate with board layout design tools that are coupled to the computer system 100. The computer system 100 can be coupled to the network (e.g., the Internet) using the network connection, I/O device 108.

Automatic Checking of Topology Layout

Accordingly, various embodiments of the present invention disclose a method and apparatus for checking circuit topology layout routing. As a result, embodiments of the present invention are capable of automatically verifying that circuit (e.g., printed circuit board (PCB) and substrate) designs have followed the published design rules. Automating the process of checking decreases the time and cost of checking the layout of a circuit. In addition, automating the processing of checking improves the quality of the review by removing the human error factor.

Figure 2:
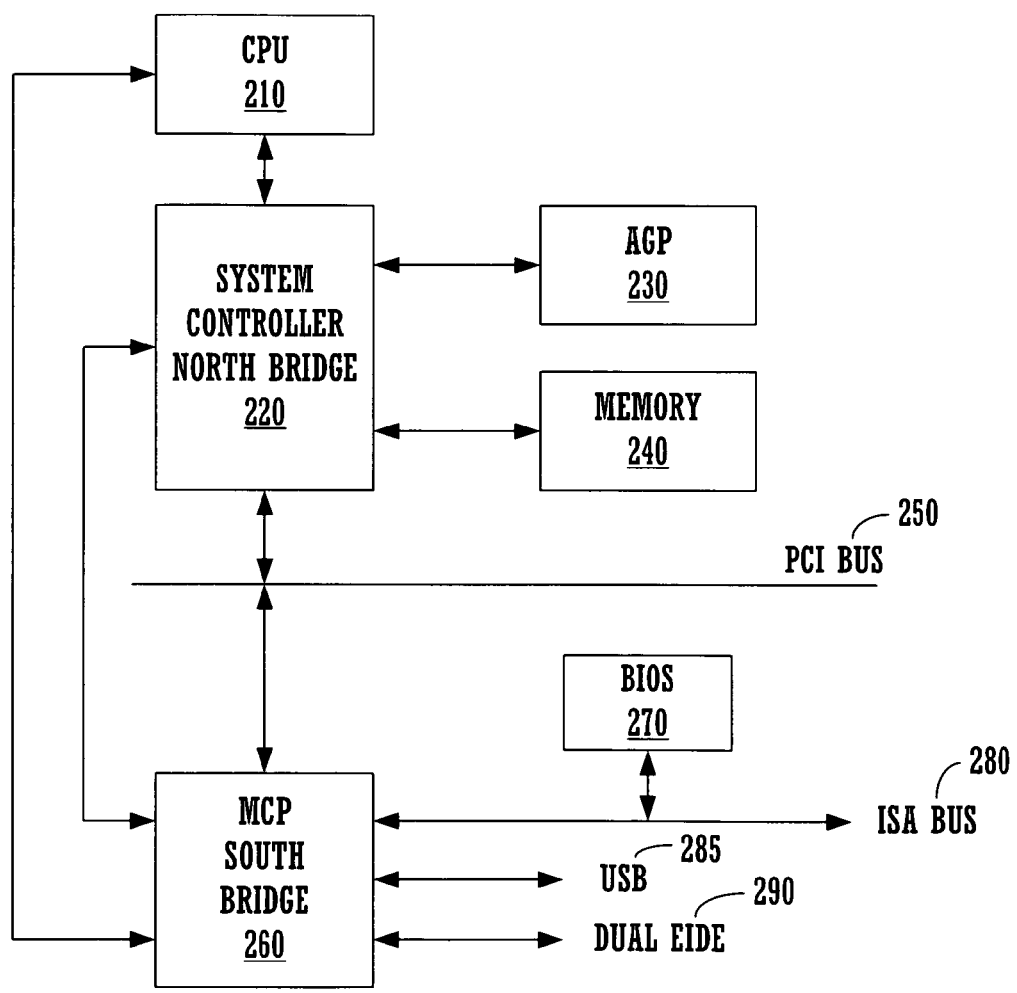
FIG. 2 is a block diagram of an exemplary motherboard upon which embodiments of the present invention is capable of automatically checking circuit routing, in accordance with one embodiment of the present invention.

Referring now to FIG. 2, a block diagram of an exemplary motherboard layout is shown, in accordance with one embodiment of the present invention. The motherboard 200 contains the primary components of a computer system. In general, the motherboard contains the central processing unit (CPU) 210, the main memory 240, support circuitry, bus controller, and connectors. FIG. 2 is exemplary only and can contain other components depending on the complexity of the motherboard 200.

The chipset of the motherboard 200 is the set of components that control the activities and functions supporting the CPU 210 on the motherboard 200. The CPU 210 is the heart of the motherboard 200 and executes and performs instructions. The chipset supporting the CPU 210 can be broken down to two main components, the north bridge 220, residing "north" of the Peripheral Component Interconnect (PCI) bus 250, and the south bridge 260, residing "south" of the PCI bus 250. The northbridge 220 couples the front side bus of the CPU 210 to the main memory 240, the accelerated graphics port (AGP) 230, bus, and the south bridge 260. In particular, the northbridge 220 functions to control data moving between the buses and the main memory 240 on the motherboard 200. The (AGP) bus 240 provides a point-to-point connection between the graphics controller, coupled to the AGP 240, and the main memory 240 to support high power graphics. As a result, images can be displayed more quickly and smoothly when using the AGP port 240 than when using the PCI bus 250.

The media and communications processor (MCP) south bridge 260 integrates the slower peripherals, like the plug-and-play industry standard architecture (ISA) bus 280 that in part is coupled to the basic I/O system (BIOS) 270 that controls devices on the motherboard 200, the universal serial bus 285, and the integrated device electronics (IDE) bus to the IDE controller.

Embodiments of the present invention are capable of automatically verifying that the motherboard layout of the motherboard 200 complies with design rules associated with the chipset on the motherboard 200. For example, design rules may specify an interface to interface spacing, such as spacing between traces in the AGP interface 230 and traces in the memory interface 240, or length of a net or trace within a group in the motherboard 200, etc.

While embodiments of the present invention are described within the context of a motherboard, other embodiments are well suited to automatically checking layout routing of other circuits (e.g., those formed in expansion cards, substrates, etc.).

Figure 3:
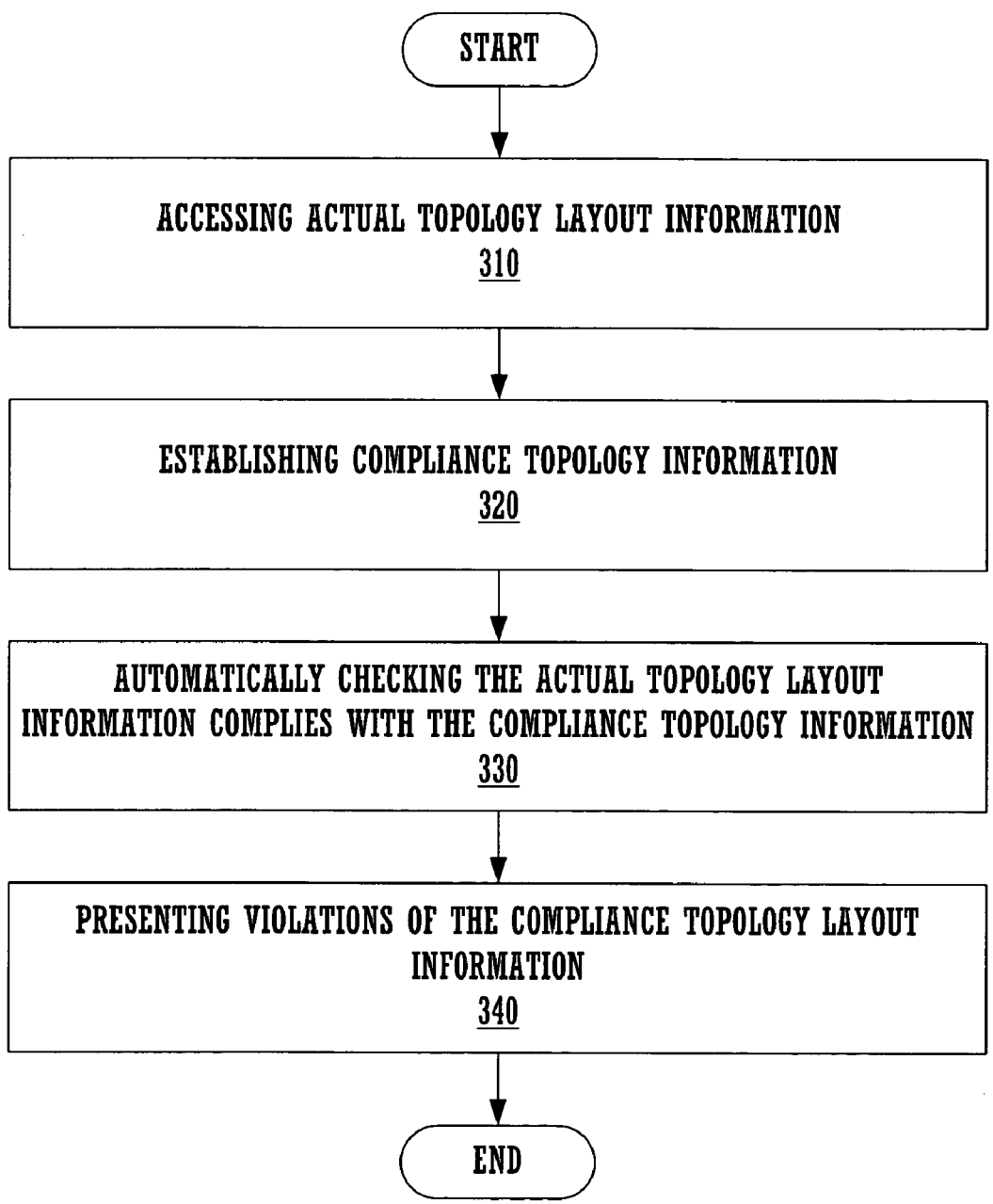
FIG. 3 is a flow chart illustrating steps in a computer implemented method for automatically checking circuit routing, in accordance with one embodiment of the present invention.

Referring now to FIG. 3, a flow chart 300 is disclosed illustrating steps in a method for automatically checking integrated circuit routing, in accordance with one embodiment of the present invention. More specifically, the present embodiment is capable of verifying that a circuit, such as those formed in a PCB or substrate topology layout, complies with design rules, for example, design rules integrating the circuit (e.g., chipset components, CPU, etc.) of the PCB or substrate. In short, the present embodiment is capable of tracking connectivity (e.g., buses, traces, etc.) between components of a circuit based on a topology layout rather than proprietary information, such as a netlist.

While embodiments of the present invention are described within the context of a PCB, other embodiments are well suited to checking routing of integrated circuits in substrates, as well as integrated circuited in a PCB. While the following discussion is described in terms of a topology, it is understood that the term "topology" includes PCBs, integrated circuits in substrates, etc.

At 310, the present embodiment accesses actual topology layout information of a circuit under test (e.g., a PCB, motherboard, IC in a substrate). For example, the present embodiment accesses topology data derived from an actual layout of the circuit. At 310, the present embodiment generates a vector formatted version of the actual topology layout information. This is done instead of generating a gerber file output, in one case, where the gerber file output depicts the geometric translation of the circuit (e.g., on a board or substrate) to the circuit manufacturer (e.g., a PCB manufacturer, substrate manufacturer, etc.). Typically, the gerber file output contains proprietary information that is tightly controlled by the board or substrate designer, and is usually not make available to other interested parties, such as the chip set designer.

In the present embodiment, the vector formatted version of the actual topology layout information is not a schematic output (e.g., netlist) of a board or substrate layout tool. As a result, one advantage of the vector formatted version allows the present embodiment to access actual topology layout information from the less restricted PCB or IC substrate layout, for example, than from a proprietary controlled schematic file. In this case, the PCB or substrate topology designer, for example, is more inclined to allow the chipset designer to run checks on the vector formatted version of the actual topology layout information than from a tightly controlled schematic of the circuit. The vector formatted version of the actual topology layout information provides enough information to verify if the topology of the PCB or substrate complies with design rules.

In one embodiment, the vector formatted version of the actual topology layout information is an output of a PCB or substrate layout tool. For example, in one case, an "extract" function in a schematic capture tool provides the vector formatted version of the actual topology layout information that describes the layout and routing of a PCB or substrate. Other embodiments are well suited to supporting other output of layout tools of other formats. In particular, the vector formatted version of the actual topology layout information provides a pin view of the circuit that describes pin locations of chips in the PCB or substrate and a connectivity view of the PCB or substrate that describes how pins are coupled.

The vector formatted version of the actual topology layout information enables the derivation of the topology of the PCB or substrate, and includes a pin file, a via file, and geometry file. The pins file describes locations of pins on the PCB or substrate, for example. The geometry file describes wire segments in the PCB or substrate, for example. The wire segments are ordered and coupled to define a net or trace in the PCB or substrate, for example. The via file describes locations of vias in the PCB or substrate, for example. In addition, in another embodiment, a file with power plane geometries is generated for each power plane in the PCB or substrate, for example.

At 320, the present embodiment establishes compliance topology information. For example, the compliance topology information is specific to the particular circuit (e.g., those formed in a PCB or substrate) under test. In this manner, the present embodiment can determine whether the circuit under test is in compliance with the compliance topology information.

The present embodiment establishes the compliance topology information based on custom design information. For example, the present embodiment selects the compliance topology information that is applicable to the circuit under test from topology layout information applicable to various topology (e.g., board and substrate) layouts. In this way, for example, the topology layout information is able to support multiple chipsets that can be used to design a topology for a circuit (e.g., PCB, motherboard, substrate, etc). As long as identifying circuit information (e.g., chipset information) is provided, the associated compliance topology information can be determined.

As a result, the present embodiment is able to determine compliance topology information defining an appropriate configuration for the circuit. For example, the compliance topology information applies to the chipset that is used in the topology of the PCB or substrate, as defined by the custom design information.

The custom design information provides basic information identifying the components of a circuit (e.g., chipsets, functional blocks, etc.), and other basic information associated with the components. For example, the custom design information provides, in part, the instance identifier of the chips in the chipset, the CPU identifier, the relevant connectors between components, the layer identifiers of planes, the manufacturer's minimum spacing and width, etc. In another embodiment, the custom design information includes user specified design information specifying geometries specific to the circuit topology (e.g., PCB or substrate).

In one embodiment, the database of design information includes topology layout design rules. The topology layout design rules provide geometric constraints for various components (e.g., chipsets, connectors, etc.) in their integration into a circuit (e.g., spacing constraints, length limitations, etc.). In this way, the same set of published topology layout design rules is able to support multiple components that can be used to design a circuit topology in a PCB or substrate, for example. The associated topology layout design rules are based on the custom design information and are applicable to the components supporting the circuit that is being checked.

For instance, the present embodiment supports design rules that include, but are not limited to, the following: rule number; interface name; group name; layer name; trace width; serpentine space; group spacing; group to group spacing; interface to interface spacing; minimum length; maximum length; length match range; match mode; match to group; match range value; termination type; termination instantiation; termination maximum stub length; and termination rail.

In one embodiment, the topology layout information includes design knowledge. In general, the design knowledge maps the signals for various components (e.g., chipsets, connectors, etc.) in their integration into a circuit (e.g., those formed in a PCB, motherboard, substrate, etc.). In this way, the same database of design knowledge is able to support multiple components that can be used to design a circuit. The associated topology layout design knowledge is based on the custom design information and is applicable to the components supporting the circuit under test. In particular, the reference design knowledge maps signal names to specific device pins and specifies which signals belong to which groups and interfaces for the circuit under test. For instance, substrate lengths are provided describing the length of the bonding and substrate wiring on an associated chip.

In this way, a compliance topology can be mapped to the actual topology of a circuit (e.g., those formed in a PCB, motherboard, substrate, etc.). For example, customer names used by the topology designer and outputted as actual topology layout information, or topology data, can be mapped to reference names used in the design knowledge of the compliance topology information applicable to the circuit under test. As such, the compliance topology information (rules and knowledge) can be applied through translation to the actual topology of the PCB or substrate.

At 330, the present embodiment automatically checks the topology layout information complies with the compliance topology information. For example, the present embodiment checks to verify that the topology data of the circuit (e.g., those formed in a PCB, substrate, etc.) under test complies with the compliance topology layout information. In particular, the present embodiment checks to verify that the actual topology layout information describing topology data of the circuit under test complies with the compliance design rules. For example, the present embodiment automatically checks to verify that the PCB or substrate designer has connected the various components of the chipsets as specified by the compliance topology design rules.

Checks that are performed are designed to verify that compliance design rules established by the primary designer (e.g., chipset designer) are followed by the circuit designer (e.g., PCB or substrate designer), in one embodiment. For example, checks include, but are not limited to, the following: checking spacing violations, that are listed by net; checking length violations, that are listed by group; checking width violations, that are listed by net; checking power pin connectivity; checking power plane boundaries of signals in the circuit under test; checking termination of nets in the circuit under test, etc. Also, the present embodiment can check spacing violations, length violations and width violations in a text format so that violations can be easily imported into a spreadsheet.

Moreover, other embodiments of the present invention are capable of generating an output file in table format that provides power plane naming cross-referencing, and signal name and grouping cross-referencing. Also, another embodiment provides a list of component pins and their substrate lengths, as provided by the associated topology layout design knowledge.

At 340, the present embodiment presents violations of the compliance topology information. For example, the present embodiment presents violations of the compliance design rules. The violations are presented in an easy to reference format, such as a list, or table, or spreadsheet, etc.

In one embodiment, the operations described in flow chart 300 are performed automatically. For example, the present embodiment is capable of automatically verifying if a topology layout routing complies with topology layout design rules associated with the chipset used in the PCB or substrate.

Figure 4:
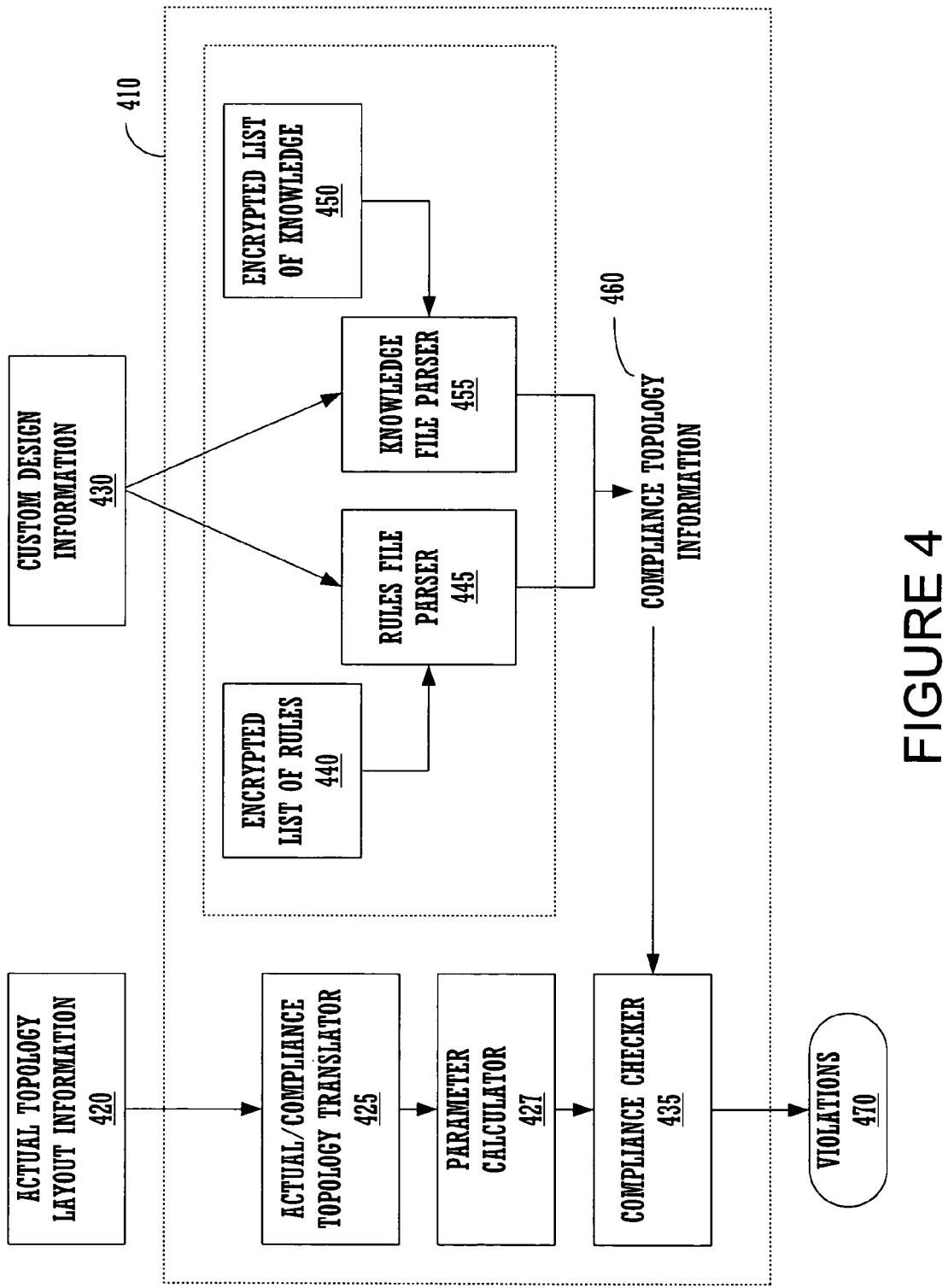
FIG. 4 is a flow diagram of information through a system that is capable of automatically checking a circuit topology layout routing, in accordance with one embodiment of the present invention.

FIG. 4 is a data flow diagram illustrating the flow of information in a checking system 410 that is capable of automatically checking topology layout routing in a circuit (e.g., those formed in a PCB, motherboard, substrate, etc.), in accordance with one embodiment of the present invention. For example, embodiments of the present invention shorten the quality control within the design phase of the PCB or substrate to decrease the time-to-market for chipset designers.

Inputs provided into the checking system 410 include actual topology layout information 420 and the custom design information 430. The actual topology layout information 420 is vector formatted topology data derived from a layout tool. For example, the actual topology layout information 420 is an output of a board or substrate layout tool. Also, the custom design information 430 provides basic information identifying the components (e.g., chipset, connectors, etc.) of a circuit, and other basic information associated with the components used in the circuit (e.g., those formed in a PCB, substrate, etc.). From these inputs, the checking system 410 is capable of automatically verifying if the topology layout complies with design rules specific to the circuit.

As shown in FIG. 4, the actual topology layout information 420 is provided as an input to the checking system 410. For example, the actual topology layout information 420 includes a pins file describing locations of pins in the topology (e.g., PCB or substrate), a geometry file describing wire segments in the topology, and a via file describing locations of vias in the topology of the circuit.

More specifically, the actual topology layout information 420 is provided to an actual/compliance topology translator 425. The actual/compliance topology translator 425 translates the vector formatted actual topology layout information 420 to a format compatible with the vector formatted compliance topology information 460. For example, the translator 425 matches the format of the actual topology layout information 420 to the format of the compliance topology information 460. In that way, a compliance check can be performed to determine if the actual topology layout information 420 complies with the compliance topology information 460. Derivation of the compliance topology information 460 is described in full below.

The custom design information 430 is inputted into the compliance topology builder 490 of the checking system 410 to determine the compliance topology information. In particular, the custom design information 430 is inputted to build compliance topology information that is associated with a circuit under test. The compliance topology builder 490 includes an overall list of rules 440, an overall list of knowledge 450, a rules file parser 445, and knowledge file parser 455. Compliance topology information 460 is generated by the compliance topology builder 490 from which it can be determined whether the circuit (e.g., those formed in a PCB, motherboard, substrate, etc.) under test is in compliance.

More specifically, the custom design information 430 is inputted to a rules file parser 445. The rules file parser 445 is able to parse associated design rules that define fabrication constraints specifically applicable to the circuit of the PCB or substrate. For example, the associated design rules provide geometric constraints for the topology based on the custom design information 430. The rules file parser 445 searches through an overall list of design rules 440 that are applicable to a variety of components (e.g., chipsets, connectors, etc.) for a variety of topology configurations. The rules file parser 445 selects the associated design rules from the overall list that are applicable to the circuit under test.

In one embodiment, the overall list of design rules is encrypted. In other embodiments, the overall list of design rules is not encrypted, or clear. In the encrypted case, the rules file parser 445 is able to decrypt the encrypted overall list of design rules 440 to parse the associated design rules applicable to the circuit under test. Encryption of the files provides protection of the software implementation of one embodiment of the present invention. As such, the checking system 410 is able to decrypt the encrypted design rules 440 for use within the checking system 410. Decryption is provided with a cryptography engine.

Also, the custom design information 430 is provided to the knowledge file parser 455 to determine associated design knowledge. More specifically, the knowledge file parser 455 is able to parse the associated design knowledge that maps a plurality of signals in the circuit under test based on the custom design information 430. For example, the associated design knowledge maps signal names to specific device pins and specifies which signals belong to which groups and interfaces in the circuit under test. In this way, design rules from the rules file parser 445 can be applied to a compliance topology as defined by the associated design knowledge. Also, reference names applicable to compliance topology information can be translated to the names used for the actual topology layout information.

The knowledge file parser 455 searches through an overall list of design knowledge 450 that is applicable to a variety of components (e.g., chipsets, functional blocks, etc.) for a variety of circuit (e.g., PCB, substrate, etc.) configurations. The knowledge file parser 455 selects and parses the associated design knowledge 450 that is applicable to the circuit under test.

In one embodiment, the overall list of knowledge 450 is encrypted. In other embodiments, the overall list of knowledge 450 is not encrypted, or clear. In the encrypted case, the knowledge file parser 455 is able to decrypt the encrypted overall list of knowledge 450 to compile the associated design knowledge applicable to the circuit under test. Encryption of the files provides protection of the software implementation of one embodiment of the present invention. As such, the checking system 410 is able to decrypt the encrypted design knowledge 450 for use within the checking system 410. Decryption is provided with a cryptography engine.

As shown in FIG. 4, from the associated design rules from the rules file parser 445 and the associated design knowledge from the knowledge file parser 455, compliance topology information 460 is generated or collected. The compliance topology information 460 is a vector formatted version of the circuit. After translation between the vector format of the actual topology layout information 420 and the vector format of the compliance topology information 460 by the actual/compliance topology translator 425 as described previously, the compliance topology information 460 can be used to verify that the actual topology layout information 420 is in compliance.

A parameter calculator 427 calculates the values of checking parameters as used by the compliance topology information 460. For instance, the parameter calculator 427 takes the actual topology layout information 420 and calculates lengths of nets or traces within the topology of the circuit (e.g., PCB topology, substrate topology, etc.). The parameter calculator is able to calculate widths of traces or signal lines within the circuit. The parameter calculator is able to calculate spacing between lines, groups, interfaces, etc.

A compliance checker 435 takes the actual topology layout information 420, that if necessary is further calculated to determine checking parameter values, and compliance topology information 460 and determines if the actual topology layout information 420 is in compliance with the compliance topology information 460. In particular, the compliance checker 435 takes values of checking parameters and determines if they are in compliance with the compliance topology information 460. In one embodiment, the compliance checker 435 automatically checks that the routing of traces as determined from the actual topology layout information 420 and determines if the routing of traces complies with the associated design rules as determined by the rules file parser 455.

More particularly, the compliance checker 435 performs checks to include, but not limited to, the following: checking of signals only on certain signal layers (e.g. top and bottom); trace width, in which cumulative violations of up to a specified limit are allowed to allow for chip-ball connections and test-points, etc.; minimum interface-to-interface spacing; minimum group-to-group spacing; minimum serpentine trace spacing, where spacing between parallel wire segments of a signal are checked; minimum/maximum trace length, where substrate lengths are added to the wire lengths; matched length within group; power-plane crossing where power plane boundaries of signals in the board are checked; verify correct reference planes for signals; verify termination checks for termination types, such as, series resistor (SR), pull down resistor, series pull down resistor, voltage reference, LCL, etc.; CPU and other chip power/ground connectivity check; maximum number of vias, etc.

The compliance checker 435 outputs violations 470 of the associated design knowledge and rules. The violations 470 can be presented in a readable format in an output file, in one embodiment. In another embodiment, warnings are displayed when the violation does not reach the level of an error. For example, a warning is displayed when a segment is found in the geometry file without a net name listed and then is dropped.

Using Scaled Integers

Figure 5:
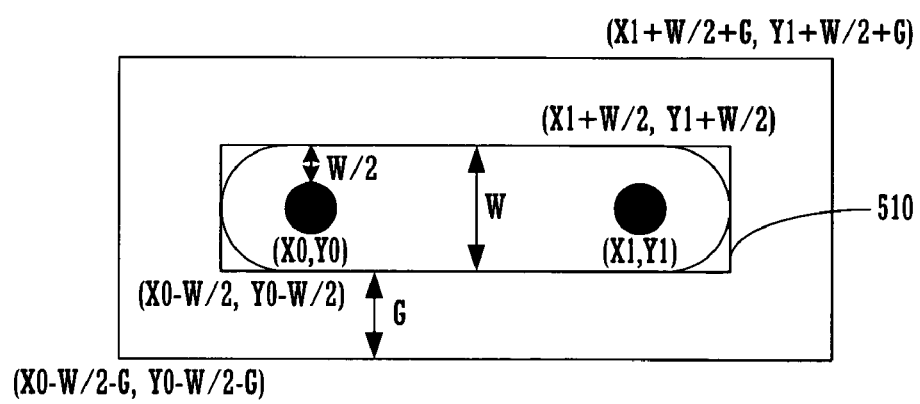
FIG. 5 is a block diagram of a wire segment, in accordance with one embodiment of the present invention.

In one embodiment, scaled integers can be used instead of floating point numbers for use in the vector format of the board layout information in order to improve performance of checking a layout of an integrated circuit (e.g., in a board or substrate). A circuit description mainly consists of pin locations and wire segment descriptions. As shown in FIG. 5, wire segments are defined by two (X, Y) points, a line width, the board layer the line is on, an impedance value, and a net name. A connected list of wire segments defines a net. For example, in FIG. 5, the wire segment 500 is defined by the zero-width line (X0, Y0) to (X1, Y1) and the width W. The actual drawn line is the rectangle with the rounded-ends that is within the rectangle 510 that extends from (X0−W/2, Y0−W/2) to (X1+W/2+G, Y1+W/2). These parameter values, such as length and width, can be used to verify that the circuit under test is in compliance with compliance topology information.

Figure 6A:
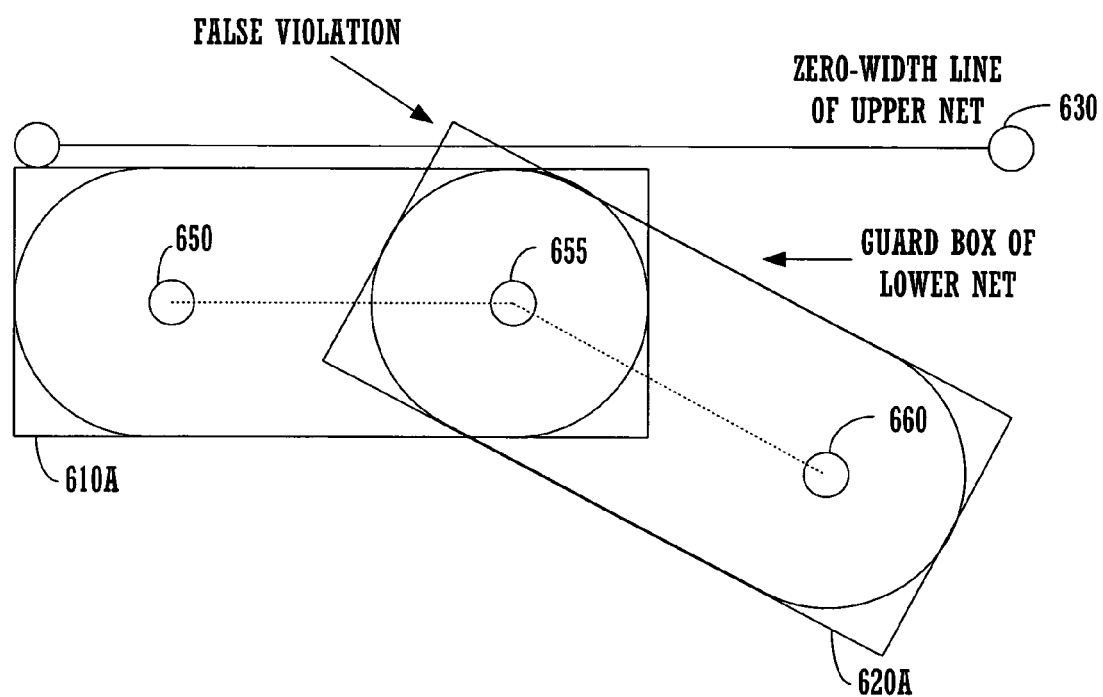
FIG. 6A is a block diagram of two adjacent nets illustrating a false violation, in accordance with one embodiment of the present invention.

FIG. 6A is a block diagram 600A illustrating a potential false violation when conducting checks (e.g., width checks) on nets, in accordance with one embodiment of the present invention. In FIG. 6A, two adjacent nets are displayed. The extended guard box 620A of the lower net is displayed. The lower net is drawn between points 655 and 660. In addition, the extended guard box 610A of the upper net is displayed. The upper net is drawn between points 650 and 655. In general, the extended guard box is the guard box grown by half of the width of the segment being checked for spacing. The upper net's zero-width line 630 is safely beyond the extended guard distance of the lower net, but because the corners are squared, the extended guard box 610A of the upper net appears to overlap the extended guard box 620A of the lower net. This could potentially result in a false violation report.

Figure 6B:
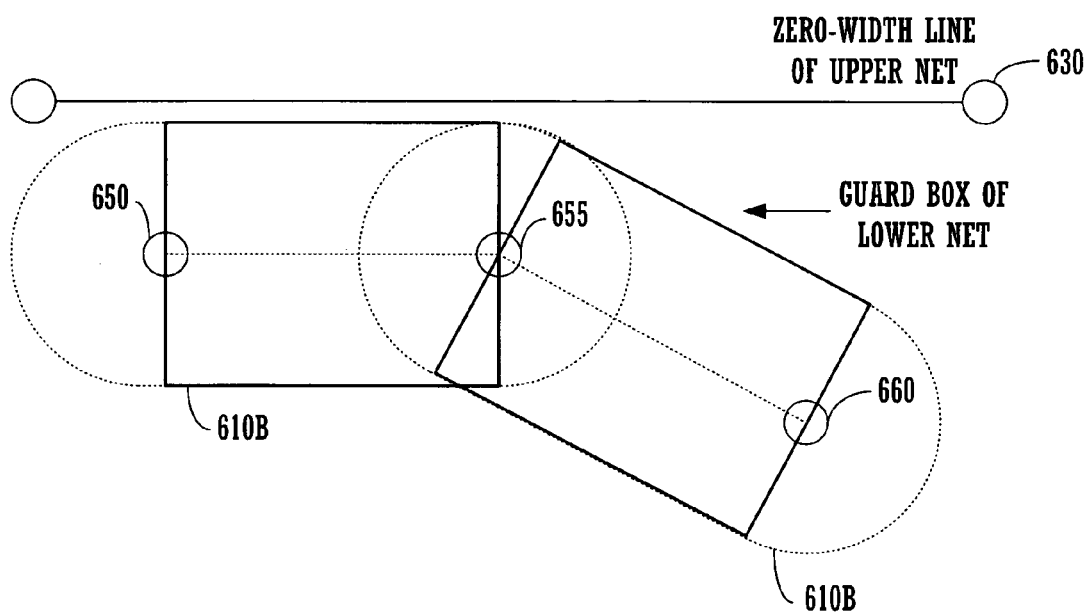
FIG. 6B is a block diagram of the two adjacent nets of FIG. 6A with truncated ends, in accordance with one embodiment of the present invention.

To prevent this false violation when conducting checks (e.g., width checks) and still limit the computational load, the rounded ends of segments can be truncated, in accordance with one embodiment of the present invention. FIG. 6B is a block diagram 600B of segments of a net with truncated ends, in accordance with one embodiment of the present invention. In FIG. 6B, the two adjacent nets of FIG. 6A are shown. The extended guard box 620B of the lower net is displayed between points 655 and 660. The dotted circular arcs around point 655 and 660 are shown for reference but are not included within the extended guard box 620B. In addition, the extended guard box 610B of the upper net is displayed between points 650 and 655. The dotted circular arcs around point 650 and 655 are shown for reference but are not included within the extended guard box 610B.

For actual lines on real boards, the length of segments will be greatly longer than their width and the loss of coverage (e.g. on spacing checks) due to the truncations of the semicircular ends will not be significant.

Figure 7:
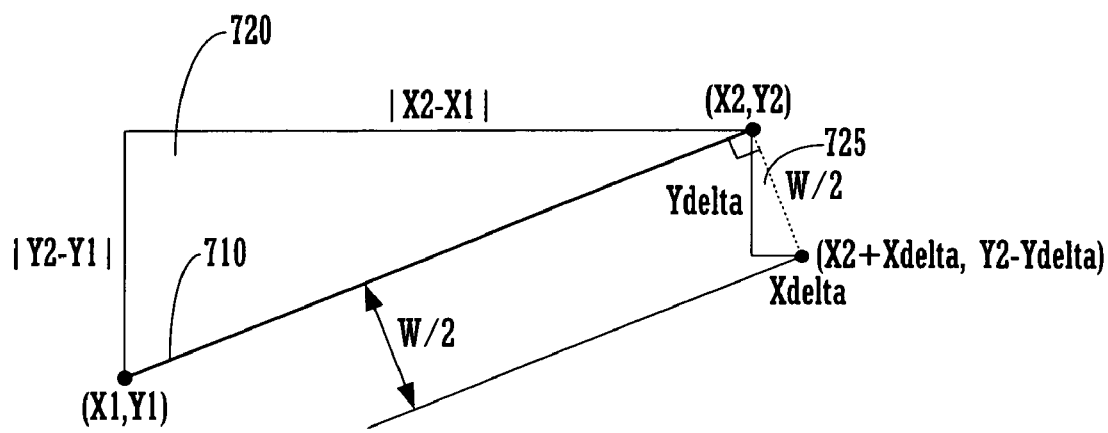
FIG. 7 is a block diagram of a net that is askew, in accordance with one embodiment of the present invention.

The above works for segments that are horizontal or vertical. For segments that are askew, a more complex treatment is required for calculating the width parameter and a corresponding guarding box for a segment. FIG. 7 is a diagram illustrating a segment 700 between points (X1, Y1) and (X2, Y2), in accordance with one embodiment of the present invention. To simplify the processing, the rounded ends can be ignored. A bounding box that extends W/2 from the zero-width line 710, both above and below. The amount that needs to be added or subtracted from X1, Y1, X2, and Y2 to form the four points of the bounding box will be Xdelta and Ydelta.

Because the two triangles 720 and 725 in FIG. 7 are congruent, the ratios of the three pairs of sides are equal, as shown below in Equations 1, 2 and 3:

$$W/2/SQRT((X2-X1)^2+(Y2-Y1)^2) \quad (1)$$

$$Xdelta/|Y2-Y1| \quad (2)$$

$$Ydelta/|X2-X1| \quad (3)$$

Solving for Xdelta and Ydelta yields in Equations 4 and 5:

$$Xdelta=W/2*|Y2-Y1|/SQRT((X2-X1)^2+(Y2-Y1)^2) \quad (4)$$

$$Ydelta=W/2*|X2-X1|/SQRT((X2-X1)^2+(Y2-Y1)^2) \quad (5)$$

The absolute value of Xdelta and Ydelta is then used to define the four points of the skewed wire segments, as follows: (X1−Xdelta, Y1−Ydelta); (X1+Xdelta, Y1+Ydelta); (X2−Xdelta, Y2−Ydelta); and (X2+Xdelta, Y2+Ydelta).

When determining the guard box for a skewed line, the same ratios are applied to the guard distance G to determine the Xdelta and Ydelta to be applied to the above four points. The guard distance are not applied to the ends of skewed line segments so that the points of the box will not be falsely identified as violating the spacing distance to an adjacent line, in one embodiment.

When comparing skewed lines to other lines, an outside bounding box whose outline is parallel to the X and Y axes is defined by the lower-left and upper-right coordinates: (Xmin, Ymin) and (Xmax, Ymax), in one embodiment. This box covers much more area than the skewed segment's guard area, but this first quick check will eliminate most lines and only the ones within this box need to be further analyzed.

Figure 8A:
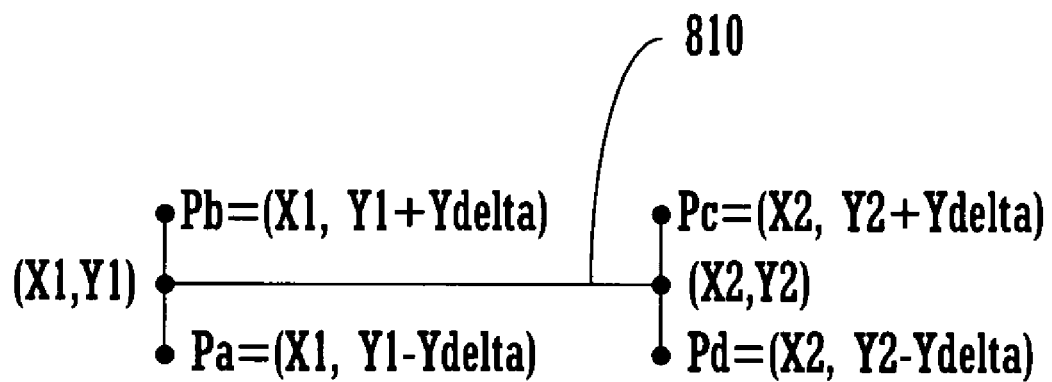
FIG. 8A is a diagram illustrating a horizontal line, in accordance with one embodiment of the present invention.
Figure 8B:
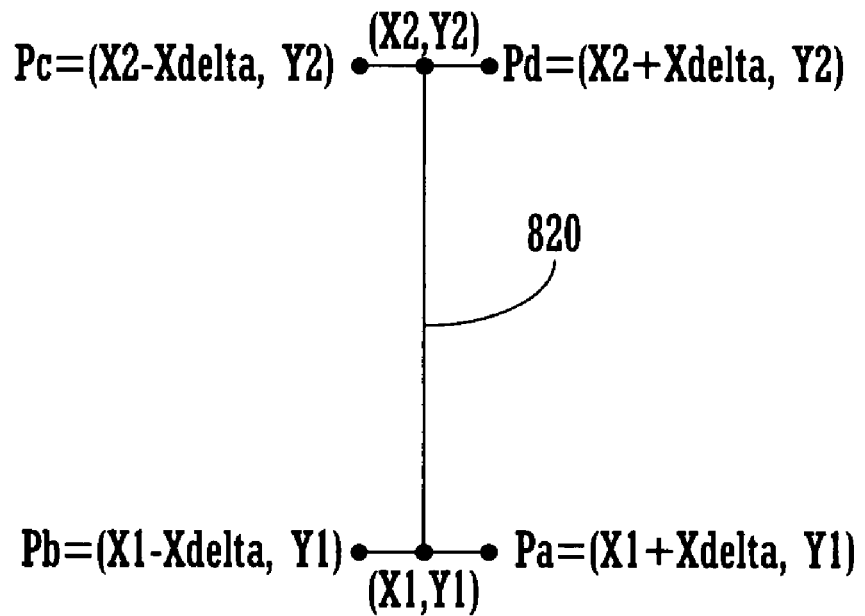
FIG. 8B is a diagram illustrating a vertical line, in accordance with one embodiment of the present invention.
Figure 8C:
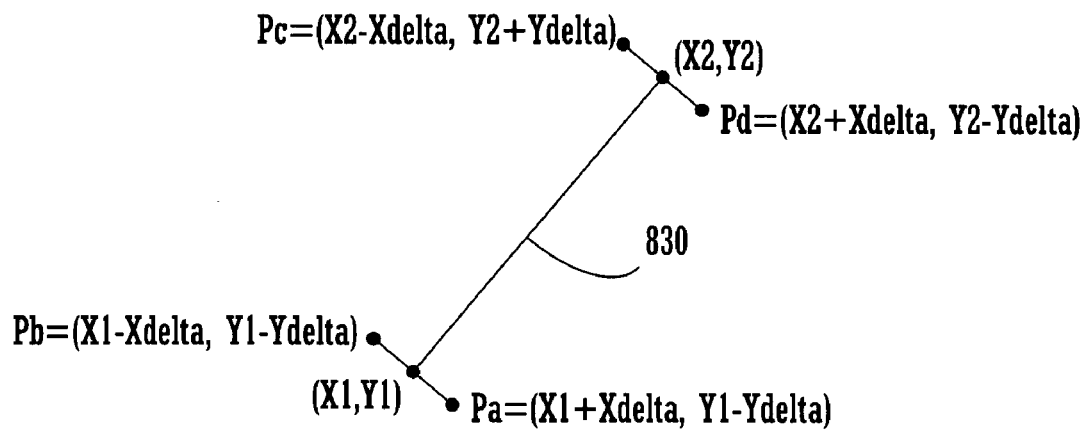
FIG. 8C is a diagram illustrating a skewed line, in accordance with one embodiment of the present invention.
Figure 8D:
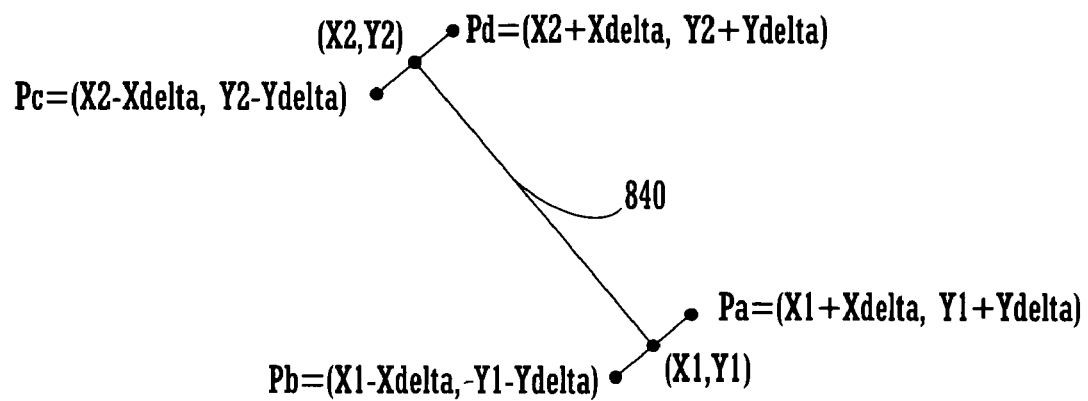
FIG. 8D is a diagram illustrating a skewed line, in accordance with one embodiment of the present invention.

In embodiments of the present invention, FIGS. 8A, 8B, 8C, and 8D are diagrams illustrating six types of lines from which various parameters can be calculated for use when checking a circuit (e.g., those formed in a PCB, motherboard, substrate, etc.) for compliance with reference design rules. FIG. 8A is a diagram illustrating a horizontal line 810. FIG. 8B is a diagram illustrating a vertical line 820. FIG. 8C is a diagram illustrating a skewed line 830 from lower-left to upper-right, or upper-right to lower-left by reversing endpoints. FIG. 8D is a diagram illustrating a skewed line 840 skewed from lower-right to upper-left, or from upper-left to lower-right by reversing endpoints. When determining the four points (Pa, Pb, Pc, and Pd) of the boxes 810, 820, 830, and 840 that determine the extent of the physical wire, of the guard box or of the extended guard box, it is necessary to consider the type of line, as shown in FIGS. 8A-8D.

In one embodiment of the present invention, a signal can consist of many wire segments and can continue through resistors (or similar components) for use when calculating lengths of a net that can be checked against reference design rules applicable to the circuit under test. The present embodiment traces a signal from a starting component to an ending component as defined in a rules file. When calculating the length of the net, intermediate, or through, components are traversed and are of zero length, in accordance with one embodiment. This is accomplished by knitting together the nets before and after the through component. The component is then replaced with a short zero-width wire. When accumulating segment lengths, a zero-width segment will also be assumed to have zero length, or optionally the length of the component. A zero-width marker can also be used to flag the presence of a component.

In one embodiment, a comparison is made between wire segments to check their spacing. The rules file details the minimum spacing between the two lines representing the wire segments. This spacing requirement depends upon several factors, including the two lines, whether they are of the same group (e.g., timing group), whether they are of the same interface or different interfaces, etc.

To determine spacing between wire segments, for each line and adjacent line type, a guard rectangle is drawn around the wire segment that extends from (X0−W/2−G, Y0−W/2−G) to (X1+W/2+G, Y1+W/2+G), in one embodiment. The distance G depends upon the line and whether the adjacent line is in the same Group or Interface. Skewed lines will have their increments/decrements scaled, as described above for Xdelta and Ydelta.

Two wire segments are considered non-violating if the rectangle that describes the first segment's guard area does not overlap with the second wire segment's rectangle that describes the segment's wire. It is acceptable for the two rectangles to be adjacent, but not overlap. Most line segments will not overlap, as one wire segment will be unambiguously above, below, to the left or to the right of the other.

Building Up Nets from Wire Segments

In one embodiment of the present invention, wire segments are obtained from the geometry file that is a vector formatted output of the layout of a circuit (e.g., those formed in a PCB, motherboard, substrate, etc.). The wire segments are listed, one-per-line, with the endpoints of the segment, net name, width and an impedance value. A linked list is built for each net name of the segments. The segments can be stored in the same order as they appear in the geometry file. These wire segments can be combined to calculate lengths of nets that are compared to compliance topology layout information for compliance.

After all of the vector formatted topology data derived from the actual topology layout information (e.g., the pins file, the geometry file, and the vias file) and the custom design information are read, then each net's segments are ordered, in one embodiment. This ordering is done by starting at a net's source or destination pin location, of which the entry for that net name is located in the pins file. Segments are removed from the net's linked list and placed in a temporary list. Segments that have an end-point at that location are removed from the temporary list and placed on the net's linked list. If more than one segment has that target end-point, then the 2nd through nth segments are placed in an orthogonal linked list of forks. The process is repeated, with the far end-point of each newly re-attached segment as the target used when searching the temporary list of segments for that net.

When conducting length checks in one embodiment, the calculation of length of a net returns the shortest distance to the matched end component from the starting component or starting pin, and all linked wire segments in between. In one instance, the end component is any component. In another instance, the end component is matched to any component connected to a power or ground net. In another case, the end component is any non-instanced component not connected to a power or ground net. In another case, the end component is any component connected to a power net, but not to a ground net. In another case, the end component is any component connected to any net but a ground net. In another case, the end component is connected to the net as specified.

To calculate the length of a net for use in a length check, the present embodiment walks the linked list of wire segments. For each net, the present embodiment attempts to order the elements of the segments linked list so that the segments start at the start pin location (defaults to be on the TOP layer) and continue sequentially with one segment's end point equal to the next start point. When a layer change is detected, the segment's via-at-start member is analyzed. When one segment does not touch the next segment, then that segment is disconnected.

If there are any segments left in the temporary list after the process has exhausted connected segments, then these are just attached to the end of the net's linked list with a notation that there was a disconnect seen at the first segment, in one embodiment.

Finally, the segments that were left over are inspected to determine if they were connected, in one embodiment. Wherever there was a break in connectivity, the disjoint segment is marked as disconnected. Disconnects should not occur in a complete database, but by keeping the segments in the order that they appeared in the geometry file, the number of disconnects are reduced, even for an incomplete board.

In one embodiment, if a disconnect is seen when calculating the length of a net, then the length can be assumed to be the entire sum of all segments. A warning can be displayed when disconnects are seen during this processing.

For example, the location of vias is determined from the vector formatted output of the board layout in the vias file. Each segment may be coupled to a via. A total count of vias is also maintained in the per-net data structure, in one embodiment.

Line Violations and Wire Segment Intersections

To speed up comparisons, a minimum X, maximum X, minimum Y and maximum Y for each of the rectangles of a wire segment is maintained, in one embodiment. The rectangles include a wire rectangle that is stored in the segment class, a guard rectangle for the same group, a guard rectangle for same interface, and a guard rectangle for different interfaces.

In one embodiment, when conducting spacing checks, the spacing between two wires is satisfactory if the following conditions are met in the following checks:

guard rectangle's minimum X>=second wire's wire rectangle's maximum x; or guard rectangle's maximum X<=second wire's wire rectangle's minimum X; or guard rectangle's minimum y>=second wire's wire rectangle's maximum Y; or guard rectangle's maximum y<=second wire's wire rectangle's minimum Y.

Figure 9:
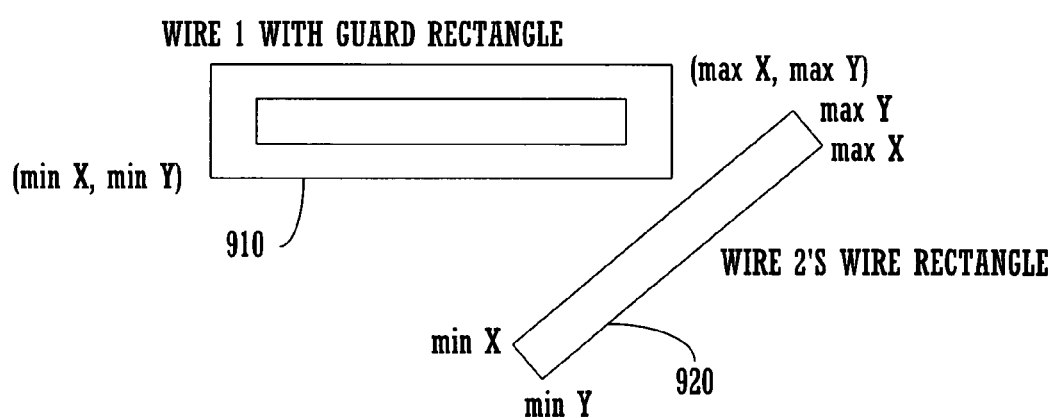
FIG. 9 is a diagram illustrating the case where two wire segments do not overlap, in accordance with one embodiment of the present invention.

If all four of these checks are false, then a more complicated check can be performed to verify that the two rectangles do not overlap, in one embodiment. For example, FIG. 9 is a diagram 900 illustrating the case where two wire segments do not overlap, even though none of the above four conditions has been met. A guard rectangle 910 is shown around wire 1. A guard rectangle 920 is shown around wire 2.

Wire 1 and wire 2 are not in violation, even though the following conditions exist, as follows:
wire 1's min X !>=wire 2's max X; and
wire 1's max X !<=wire 2's min X; and
wire 1's min Y !>=wire 2's max Y; and
wire 1' max Y!<=wire 2's min Y.

A more detailed check will conceptually create a larger rectangle around wire 1's guard rectangle, growing it by half of wire 2's width, in one embodiment. Then, all four edges of this rectangle will be checked for intersecting with the zero-width line of wire 2.

Assuming that there are two lines, as follows: line 1: (X1, Y1) to (X2, Y2); and line 2: (X3, Y3) to (X4, Y4), then a denominator, D, is calculated and checked for 0. D is defined as follows: in Equation 6.

$$D=(Y4-Y3)(X2-X1)-(X4-X3)(Y2-Y1) \qquad (6)$$

If D is 0, then the two lines are parallel.

Using D, another intermediate term, Ua is computed in Equation 7, as follows:

$$Ua=((X4-X3)(Y1-Y3)-(Y4-Y3)(X1-X3))/D \qquad (7)$$

Finally, the possible intersection point, (X, Y), is calculated in Equation 8 and Equation 9, as follows:

$$X=X1+Ua*(X2-X1) \qquad (8)$$

$$Y=Y1+Ua*(Y2-Y1) \qquad (9)$$

Then, the possible intersection point is compared to the minimum and maximum X/Y points to determine if the point is on both line segments and if it is exactly on the line, in one embodiment. If the point is outside either of the two line segments or if it is exactly on both lines, then there is no violation of the spacing check.

In one embodiment, a serious violation is flagged if the sum of a net's segment violations exceeds 75% of the net's total length. In another embodiment, empirical reviews of an existing circuit (e.g., board circuit) show that the spacing checks should allow for small variations to accommodate real-world situations. Thus, a tolerance of +/−1% is allowed in serpentine spacing checks.

Serpentine Spacing Checks

In one embodiment, in order to match lengths of wires, serpentine sections are added to the board in places to match up line lengths in busses when conducting length checks. There are separate rule entries for the distance between serpentine sections of the same net. Checks for this spacing rule are done by comparing parallel segments within the nets that have a serpentine spacing rule. Each segment of such a net is with all "forward" segments in the same net. First, a check is performed to see if the two segments are parallel. If the two segments are parallel, then the distance is computed. On the other hand, if the lines are horizontal or parallel and they "overlap" (i.e. a line perpendicular to them can be drawn between the two segments), then the distance between them is just the difference in their Y or X values, respectively. If the two segments don't overlap, then their distance is the distance between the two endpoints that are closer together.

Figure 10:
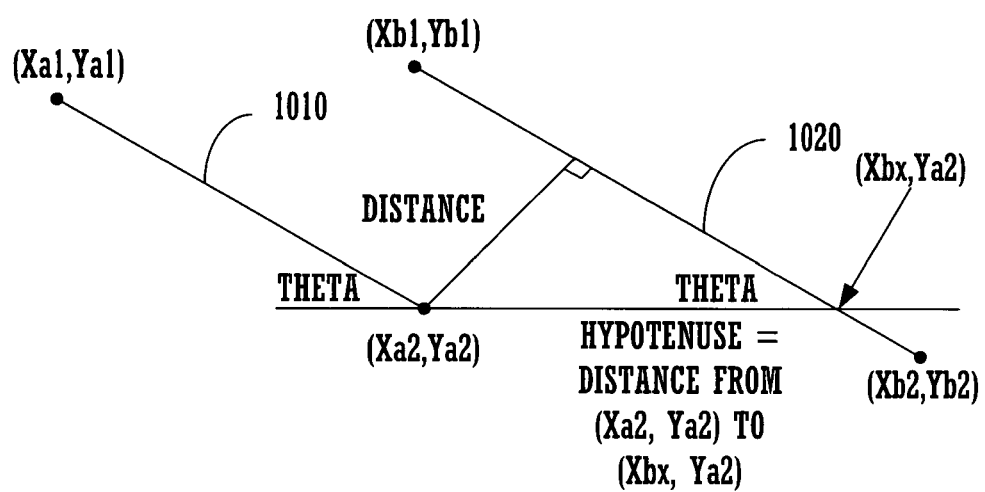
FIG. 10 is a diagram illustrating the distance between wire segments, in accordance with one embodiment of the present invention.

For segments that are not horizontal or vertical, consider the diagram 1000 illustrated in FIG. 10. The first line segment 1010 extends from (Xa1, Ya1) to (Xa2, Ya2) and the second line segment 1020 extends from (Xb1, Yb1) to (Xb2, Yb2). First, it is determined where the second line segment 1020 crosses the Y=Ya2 line, virtually extending the line if needed. This point is determined using the standard equation for a line: Y=mX+b, where m and b are derived from the endpoints of the lines. This provides a right triangle. The hypotenuse of the triangle can be calculated. As such, the side opposite from the angle theta can be calculated. In addition, the value sin(theta) can be computed as the ratio of its "opposite" and hypotenuse for the first line segment 1010, as follows in Equation 10:

$$\sin(\text{theta}) = \frac{(Ya2 - Ya1)}{sqrt((Xa2 - Xa1)^2 \div (Ya2 - Ya1)^2)} \quad (10)$$

The desired distance can then be computed as: sin (theta) *hypotenuse, if the two segments overlap (i.e. a line perpendicular to them can be drawn between the two segments). If the two lines do not overlap, then the distance between them is the distance between their closest end points. The distance is then compared with the sum of the width of the segment and the required minimum serpentine spacing. A violation is reported if this distance is less than the sum.

To determine if skewed parallel lines overlap, the two end points of the first line are projected onto the second line (i.e. a perpendicular line is drawn from these endpoints to a version of the second line that extends forever, in one embodiment. If the X values of these projected points are both below the minimum X value of the second line, then the first segment is below or to the left of the second segment and the two segments don't overlap. Similarly if both of the projected X values are above the maximum X value of the second line, then the first segment is above or to the right of the second segment and again, they don't overlap. In addition, the absolute value of the distance between the two segments can be returned, if they are parallel.

Note that a distance of "0" between two serpentine segments is not an error. This is just a line segment that is split into multiple pieces. Empirical reviews of an existing board show that the spacing checks should allow for small variations to accommodate real-world situations. Thus, a tolerance of +/-1% is allowed in serpentine spacing checks, in one embodiment.

To perform the serpentine checks, the present embodiment tries to determine which segments are the parallel mates for each segment. The present embodiment finds a mate by walking all the segments for a net with a serpentine spacing value. For each segment, following segments are compared to see if they are parallel, which also returns the distance between the segments. If the segment is parallel, then the present embodiment determines if the two segments shadow each other.

Two parallel lines "shadow" each other if a line perpendicular to one can be drawn through one (but not through an end-point) and intersect the second one. The present embodiment uses the closest shadowing parallel segments for the serpentine check.

Figure 13A:
FIG. 13A is a diagram illustrating two wire segments that shadow each other, in accordance with one embodiment of the present invention.
Figure 13B:
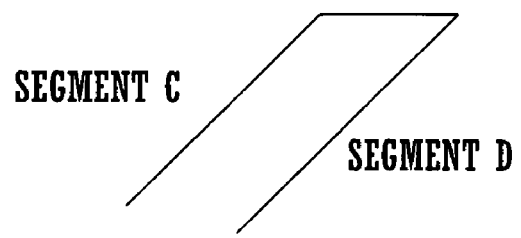
FIG. 13B is a diagram illustrating two wire segments that shadow each other, in accordance with one embodiment of the present invention.
Figure 13C:
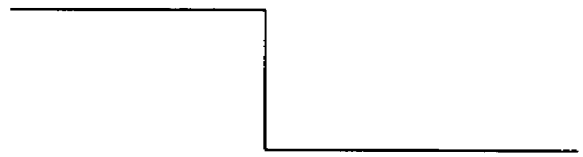
FIG. 13C is a diagram illustrating two wire segments that do not shadow each other, in accordance with one embodiment of the present invention.

FIGS. 13A, 13B, and 13C illustrate segments that shadow each other, in accordance with embodiments of the present invention. FIG. 13A illustrates a diagram 1300A of wire segments that shows segments A and B as shadows. FIG. 13B illustrates a diagram 1300B of wire segments, where segments C and D are shadows. FIG. 13C illustrates a diagram 1300C of wire segments, where segments E and F are not shadows.

Exact Spacing Checks

In one embodiment, some of the nets are differential pairs that must be exactly spaced the specified spacing distance in a check. For example, the nets are not minimally spaced as the specified spacing distance. This can be indicated in the rules file. This check is different than the standard spacing check. For instance, each segment in the net being checked will be compared with the other net's segments to determine the minimum distance between that segment and the other net. This minimum distance will be the spacing between that segment and the other net. This distance will be checked against the exact spacing value. Empirical reviews of an existing board show that the exact spacing checks should allow for small variations to accommodate real-world situations. Thus, a tolerance of +/-1% is allowed in exact spacing checks, in one embodiment.

Via Spacing Checks

In one embodiment, an exact spacing check is considered for vias. For example, a via spacing check is done for nets that match that exact spacing rule in the rules file. As such, the group spacing entry is the maximum distance that is allowed between matching vias in the two nets of a group. In other words, when one net has a via, the mating net has a via with the specified distance.

Net Length Checks

In one embodiment, the lengths of the nets are checked. The length specified in the rules file is compared with the sum of the length of all segments that connect from the source (or reference) component/pin to any pin on the destination component. If the destination component is specified as "ANY" component in the Custom Design Information file, then the first component reached by the net is used as the destination component.

Length checks are done by comparing a net's length (or a length from the start of the net to a destination component) to determine a minimum trace length in the rules file entry. Length checks are completed to determine a maximum trace length in the rules file entry. Length checks are completed to determine the length of the other nets in the same group. Also, length checks are calculated to determine the length of another group.

The reason that the length comparisons are performed against the longest of the nets in a group is because it is easier to add length to a net, than to remove it, in one embodiment.

Connecting Through Components

In one embodiment, length parameter values are calculated by connecting through components. The component being traversed is added to a net's list of segments with a width of zero. This zero-width is a flag that a component is at this "segment". The length of the component is not added into the net's length. Segments connected to the "other side" of the component are added to the first net's list of segments. This process continues until an instantiated component or a power/ground is reached.

In another embodiment, in order to improve the run-times and to avoid connecting non-related nets together through the power or ground planes, connecting-through stops when a power or ground net is reached.

When reading in the pin file, a net is considered a power/ground net if its net name is one of the names listed in a power layer. Net names listed in the custom design information power statement are marked as power/ground nets also. However, the power statement gives the net's logical name and a component/pin for that net. After the pins file is read in, the present embodiment maps the logical net names given in the power statement to the actual topology obtained from the vector formatted output from the board layout. As such, power can be mapped to the net name in the vector formatted output.

Termination Checks

Many of the nets can have termination networks on them. These are declared in the rules file as either: Series Resistor (SR), Resistor Divider or Vref (VREF), Resistor Pullup/Pulldown (PULL), LCL Filter (LCL), Series Terminator and Pullup/Pulldown (SRPULL), Arbitrary Power/Signal Filter Circuit (FILTER), or Crystal Circuit (XTAL). The termination checks will verify that the specified distances to components are implemented on the board.

Figure 14A:
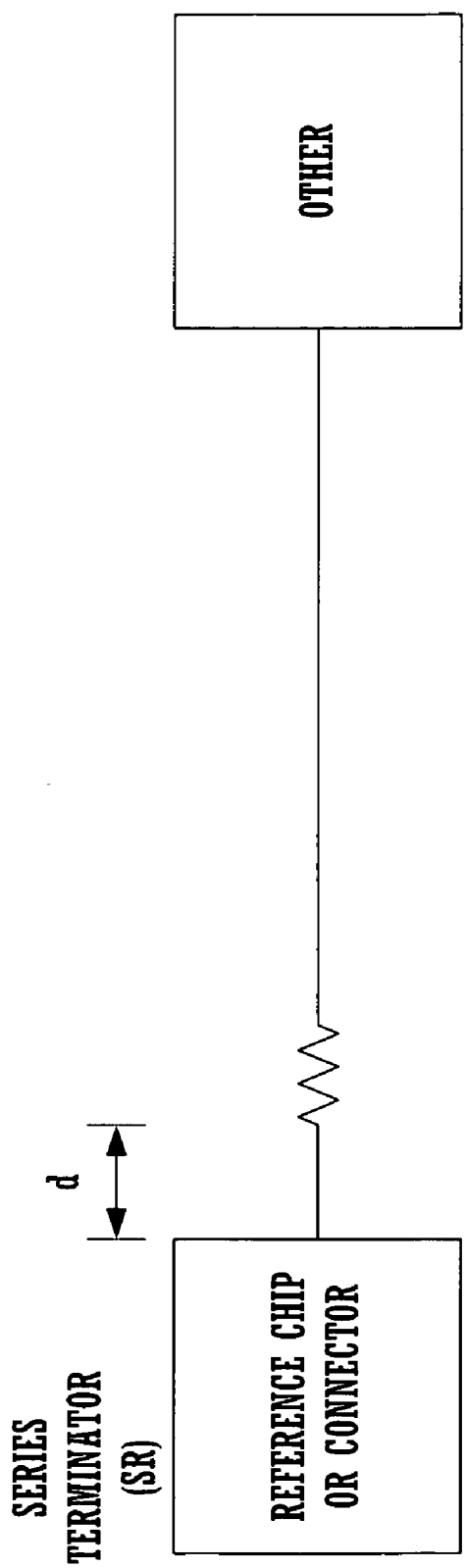
FIGS. 14A, 14B, 14C, 14D, and 14E are schematic diagrams illustrating the various termination configurations that are checked by embodiments of the present invention.
Figure 14B:
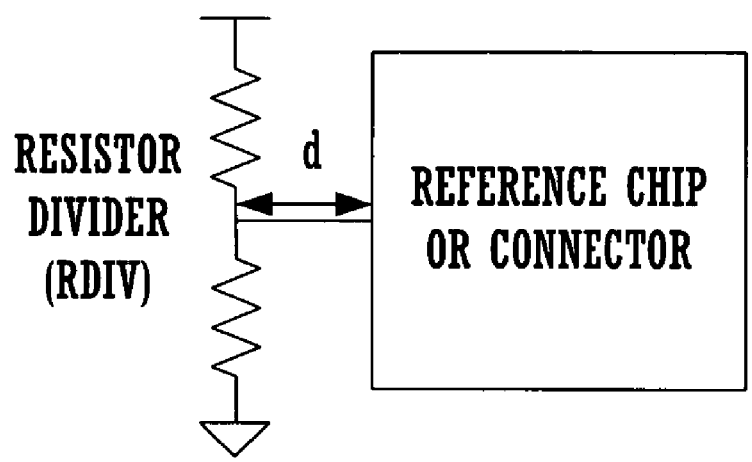
Figure 14C:
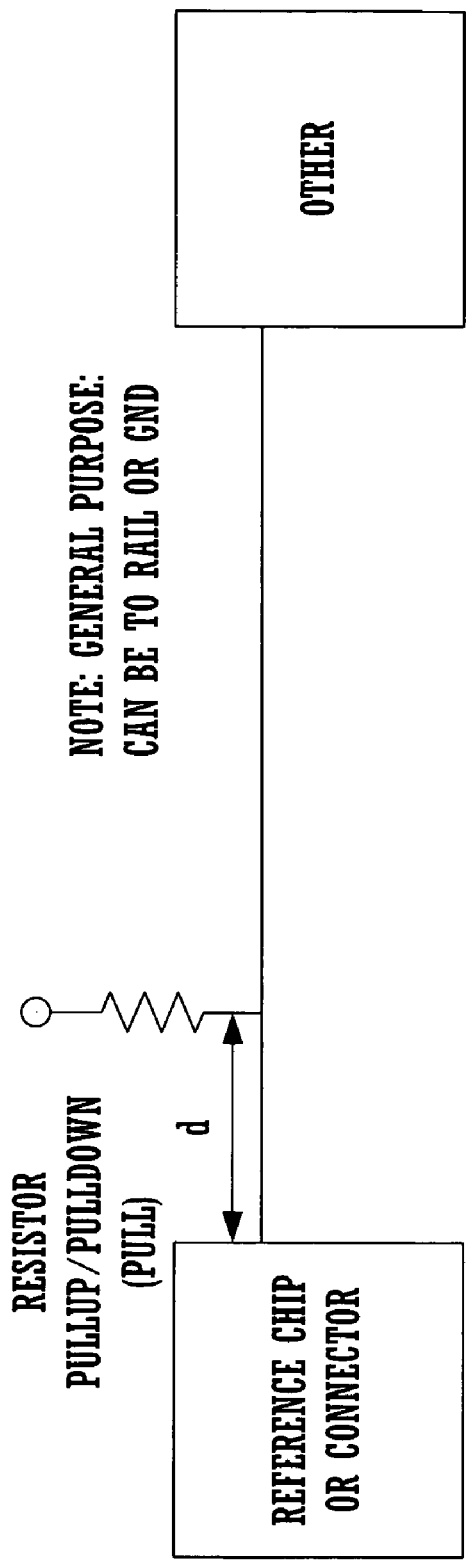
Figure 14D:
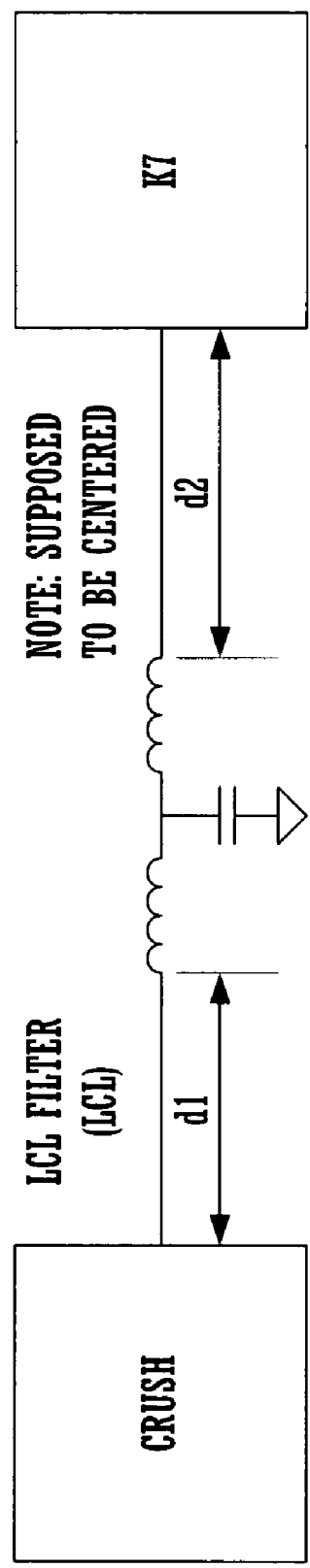
Figure 14E:
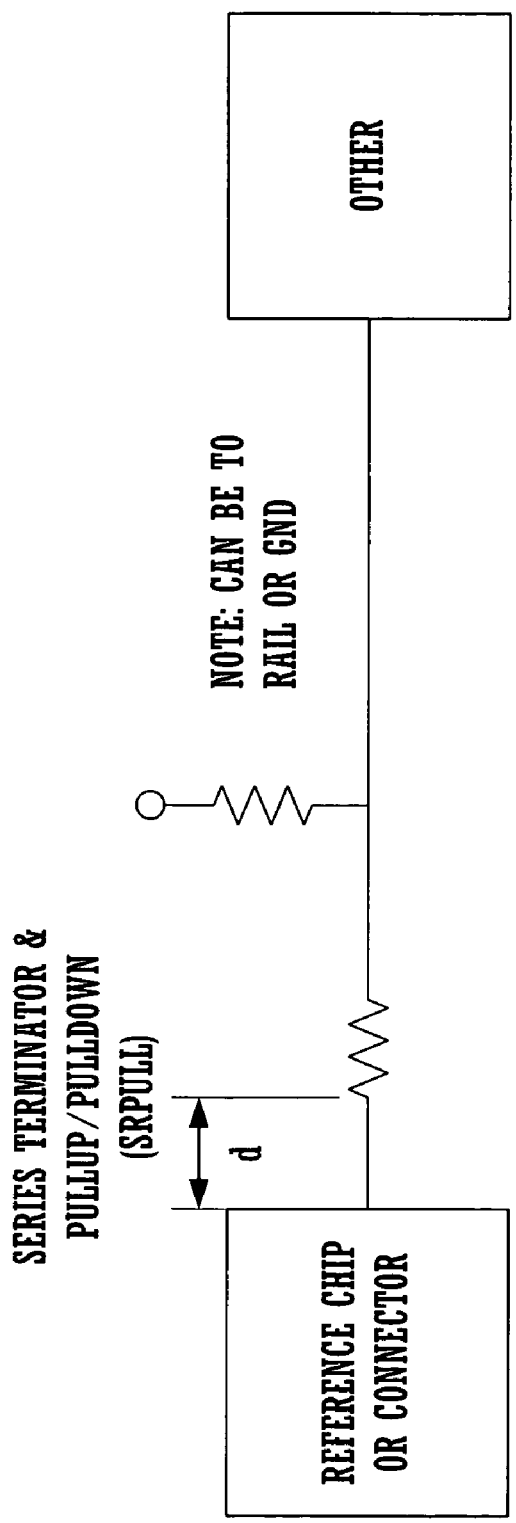

FIGS. 14A, 14B, 14C, 14D, and 14E are schematic diagrams illustrating the various termination configurations that are checked by embodiments of the present invention. FIG. 14A is a schematic diagram illustrating a termination that ends in a series resistor. FIG. 14B is a schematic diagram illustrating a termination that ends in a resistor divider (RDIV). FIG. 14C is a schematic diagram illustrating a termination that ends in a pullup/pulldown resistor. FIG. 14D is a schematic diagram illustrating a termination that ends in an LCL filter. FIG. 14E is a schematic diagram illustrating a termination that ends in a series terminator and pullup/pulldown resistor.

Power Plane Crossing Checks

In one embodiment, signals that are on the plane adjacent to the power plane are checked against the boundaries of the power planes. Signals that cross a power plane boundary are flagged. These checks are similar to those described above. Also, signal wire segments are compared against power plane boundary segments. Any crossings will be flagged as a violation.

In one embodiment, to prevent missing the case where a net crosses a power plane, but does so at a point where two of its line segments meet, a violation occurs if any of a net's line segments "touches" or comes within a guard band of a power plane boundary.

Power Plane Reference Checks

In one embodiment, some signals are marked in the rules file as having a reference plane. As such, when the signal is routed on the layer adjacent to the power plane (specified in the custom design information), then this signal must be over the specified power plane. A check can be performed to verify this condition.

This check is complicated by the fact that the power planes are of random geometry with convex and concave features in an odd-shaped closed "curve." The determination of whether or not a net is over the reference plane is accomplished by the following process, in one embodiment. For all segments in the net, if the segment is on the plane adjacent to the power plane, then a horizontal line is conceptually drawn across the board from any point on the segment (e.g., one end point) to the left edge of the board. Then, the present embodiment checks all of the reference power plane's segments for intersections with the horizontal line drawn above. If the number of reference power plane segments crossed is odd, then the segment is over the reference plane, otherwise it is not.

If the segment is not over the reference power plane, then the length of the net is added to one of two sums: before the first via and after the first via. This is to accommodate the need for flexibility when the net is first breaking out of the ballout area. If there is a small violation length before the first via and a similar length after the first via, then the second violation length is probably needed for the break-out area by the destination chip.

Figure 11:
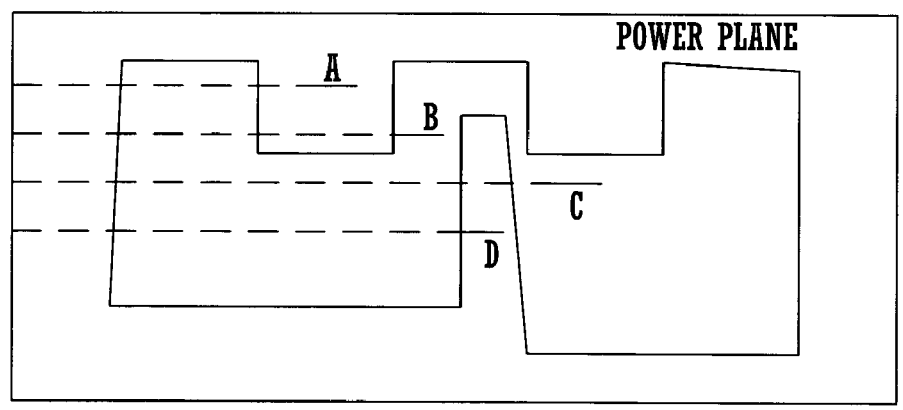
FIG. 11 is a diagram illustrating a power plane reference check, in accordance with one embodiment of the present invention.

FIG. 11 is a diagram 1100 illustrating the even/odd power plane reference check, in accordance with one embodiment of the present invention. The line segments A, B, C, and D are on the TOP layer. The Power Plane is on the LAYER 2, adjacent to the TOP layer. The odd-shaped marked Power Plane is the reference power plane. Note that segments A and D are not over the reference plane, but B and C are. Thin lines are conceptually drawn from the segments to the left edge of the board. The number of crossings of each of the thin lines is observed. The segments that are over the reference power plane can have an odd number of crossings. Those that are not over the reference power plane can have an even number of crossings. A crossing is considered as a unique intersection point, as it is possible to cross a power plane at a boundary of two of its segments. Such an intersection can count as one crossing, even though two power plan segments are being crossed. While FIG. 11 is shown with four layer boards, other embodiments are well suited to power plane reference checking of boards with less or more than four layers.

The geometry of the power plane is provided as line segments and small arcs, in one embodiment. To simplify the line crossing software, the arcs are treated as lines segments. However, the lengths of arcs are correctly computed and accounted for. The arcs are assumed to be less than or equal to 180 degrees.

Arcs are 45 degrees, 90 degrees, 135 degrees, or 180 degrees. The present embodiment can accept any arc up to and including 180 degrees, as the input from the geometry file includes the starting point, ending point and center of the arc.

Figure 12:
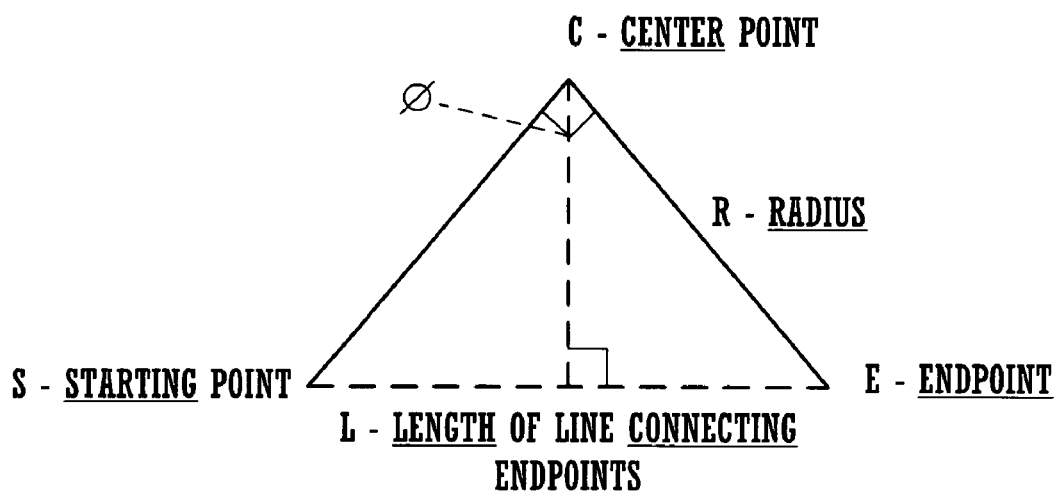
FIG. 12 is a diagram illustrating the calculation of the length of a wire segment and/or line, in accordance with one embodiment of the present invention.

FIG. 12 is a diagram 1200 illustrating the calculation of the length of the line between connecting endpoints for use in calculating lengths of traces or nets, in accordance with one embodiment of the present invention. An isosceles triangle created by the line segments SC, CE, and ES. The angle between the lines SC and CE can be computed by noting that dividing the isosceles triangle in half, where each half forms a right triangle. Thus, the length can be calculated from the following equations 11 and 12, as follows:

$$\sin(alpha/2) = (L/2)/R \tag{11}$$

and $$alpha = 2 * \text{inverse } \sin((L/2)/R) \tag{12}$$

While the methods of embodiments illustrated in flow chart 300 show specific sequences and quantity of steps, the present invention is suitable to alternative embodiments. For example, not all the steps provided for in the method are required for the present invention. Furthermore, additional steps can be added to the steps presented in the present embodiment. Likewise, the sequences of steps can be modified depending upon the application.

Embodiments of the present invention, a method and apparatus for automatically checking topology layout routing of a circuit have been described. While the invention is described in conjunction with the preferred embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

What is claimed is:

1. A method for checking circuit routing, comprising:
   a) accessing actual topology layout information of a circuit, wherein said actual topology layout information is in a vector format that is derived from a topology of said circuit;
   b) establishing compliance topology information, wherein said compliance topology information is based on custom design information that describes basic information of said circuit;

c) checking said actual topology layout information complies with said compliance topology information; and
d) presenting violations of said compliance topology information.

2. The method of claim 1, wherein said circuit is formed in a printed circuit board (PCB) circuit.

3. The method of claim 1, wherein said circuit is formed in a substrate.

4. The method of claim 1, wherein said actual topology layout information comprises:
a pins file describing locations of pins in said circuit;
a geometry file describing wire segments in said circuit; and
a via file describing locations of vias in said circuit.

5. The method of claim 1, wherein b) comprises:
b1) accessing custom design information of said circuit; and
b2) selecting said compliance topology information applicable to various topology layouts.

6. The method of claim 5, wherein said custom design information comprises identifying information of a chipset in said circuit.

7. The method of claim 5, wherein said custom design information comprises identifying information of a media processor in said circuit.

8. The method of claim 5, wherein said compliance topology information comprises:
design rules that provide geometric constraints for said topology based on said custom design information.

9. The method of claim 8, wherein said design rules are taken from a list comprising:
trace width;
minimum length; and
maximum length.

10. The method of claim 8, wherein said design rules are taken from a list comprising:
serpentine space; group spacing;
group to group spacing; and
interface to interface spacing.

11. The method of claim 8, wherein said design rules are taken from a list comprising:
termination type;
termination maximum stub length; and
termination rail.

12. The method of claim 5, wherein said compliance topology information comprises:
design knowledge that maps a plurality of signals in said circuit based on said custom design information.

13. The method of claim 1, wherein said c) further comprises~
checking trace lengths and widths in said actual topology layout information.

14. The method of claim 1, wherein said c) further comprises:
checking spacing in said actual topology layout information.

15. The method of claim 1, wherein said c) further comprises:
checking power plane boundaries of signals in said actual topology layout information.

16. The method of claim 1, wherein said c) further comprises:
checking termination of nets in said actual topology layout information.

17. A system for checking topology layout routing, comprising:

a compliance topology builder for building compliance topology information based on custom design information;
a translator for translating between actual topology layout information and said compliance topology information;
a compliance checker for checking said actual topology layout information complies with said compliance topology information.

18. The system of claim 17, further comprising:
a calculator for calculating parameters of said actual topology layout information.

19. The system of claim 17, wherein said compliance checker checks that routing of traces derived from said actual topology layout information complies with said compliance topology information.

20. The system of claim 17, wherein said compliance topology builder comprises:
a rules file parser for automatically accessing associated design rules that provide geometric constraints for said actual topology layout information.

21. The system of claim 17, wherein said compliance topology builder comprises:
a knowledge file parser for automatically accessing associated design knowledge that maps a plurality of signals in said actual topology layout information.

22. The system of claim 17, wherein said compliance checker performs checks comprising:
trace lengths checks;
spacing checks;
trace width checks;
trace termination checks; and
power plane checks.

23. A computer system comprising:
a processor for processing information; and
a computer readable memory coupled to said processor and containing program instructions that, when executed cause said processor to implement a method for checking circuit routing, comprising:
a) accessing actual topology layout information of a circuit wherein said actual topology layout information is in a vector format that is derived from a topology of said circuit;
b) establishing compliance topology information wherein said compliance topology information is based on custom design information that describes basic information of said circuit;
c) checking said actual topology layout information complies with said compliance topology information; and
d) presenting violations of said compliance topology information.

24. The computer system of claim 23, wherein said circuit is formed in a printed circuit board (PCB).

25. The computer system of claim 23, wherein said circuit is formed in a substrate.

26. The computer system of claim 23, wherein said actual topology layout information comprises:
a pins file describing locations of pins in said circuit;
a geometry file describing wire segments in said circuit; and
a via file describing locations of vias in said circuit.

27. The computer system of claim 23, wherein b) in said method comprises:
b1) accessing custom design information of said circuit; and
b2) selecting said compliance topology information applicable to various topology layouts.

28. The computer system of claim 27, wherein said custom design information comprises identifying information of a chipset in said circuit.

29. The computer system of claim 27, wherein said custom design information comprises identifying information of a media processor in said circuit.

30. The computer system of claim 27, wherein said compliance topology information comprises:
   design rules that provide geometric constraints for said circuit based on said custom design information.

31. The computer system of claim 30, wherein said design rules are taken from a list comprising:
   trace width;
   minimum length; and
   maximum length.

32. The computer system of claim 30, wherein said design rules are taken from a list comprising:
   serpentine space;
   group spacing;
   group to group spacing; and
   interface to interface spacing.

33. The computer system of claim 30, wherein said design rules are taken from a list comprising:
   termination type;
   termination maximum stub length; and
   termination rail.

34. The computer system of claim 27, wherein said compliance topology information comprises:
   design knowledge that maps a plurality of signals in said topology based on said custom design information.

35. The computer system of claim 23, wherein said c) in said method further comprises:
   checking trace lengths and widths in said actual topology layout information.

36. The computer system of claim 23, wherein said c) in said method further comprises:
   checking spacing in said actual topology layout information.

37. The computer system of claim 23, wherein said c) in said method further comprises:
   checking power plane boundaries of signals in said actual topology layout information.

38. The computer system of claim 23, wherein said c) in said method further comprises:
   checking termination of nets in said actual topology layout information.

39. A computer readable medium for storing program instructions that, when executed implements a method for checking circuit routing, comprising:
   a) accessing actual topology layout information of a circuit wherein said actual topology layout information is in a vector format that is derived from a topology of said circuit;
   b) establishing compliance topology information wherein said compliance topology information is based on custom design information that describes basic information of said circuit;
   c) checking said actual topology layout information complies with said compliance topology information; and
   d) presenting violations of said compliance topology information.

40. The method of claim 39, wherein said circuit is formed in a printed circuit board (PCB) circuit.

41. The method of claim 39, wherein said compliance topology information comprises:
   design rules that provide geometric constraints for said topology based on said custom design information.

42. The method of claim 39, wherein said compliance topology information comprises:
   design knowledge that maps a plurality of signals in said circuit based on said custom design information.

* * * * *